US012271332B2

(12) United States Patent
Gaide

(10) Patent No.: US 12,271,332 B2
(45) Date of Patent: Apr. 8, 2025

(54) REDUNDANCY SCHEME FOR ACTIVATING CIRCUITRY ON A BASE DIE OF A 3D STACKED DEVICE

(71) Applicant: XILINX, INC., San Jose, CA (US)

(72) Inventor: Brian C. Gaide, Erie, CO (US)

(73) Assignee: XILINX, INC., San Jose, CA (US)

( * ) Notice: Subject to any disclaimer, the term of this patent is extended or adjusted under 35 U.S.C. 154(b) by 83 days.

(21) Appl. No.: 18/128,936

(22) Filed: Mar. 30, 2023

(65) Prior Publication Data
US 2024/0330222 A1 Oct. 3, 2024

(51) Int. Cl.
G06F 13/40 (2006.01)
H01L 25/065 (2023.01)
H10B 80/00 (2023.01)

(52) U.S. Cl.
CPC ...... *G06F 13/4027* (2013.01); *H01L 25/0657* (2013.01); *H10B 80/00* (2023.02); *H01L 2225/06565* (2013.01)

(58) Field of Classification Search
CPC .............................. G06F 13/4027; H10B 80/00
See application file for complete search history.

(56) References Cited

U.S. PATENT DOCUMENTS

| 10,741,524 B2 | 8/2020 | Gaide et al. | |
|---|---|---|---|
| 2010/0060310 A1* | 3/2010 | Laisne | G11C 29/816 326/16 |
| 2013/0176763 A1* | 7/2013 | Ware | H01L 23/5384 365/51 |
| 2014/0062587 A1* | 3/2014 | Koyanagi | H01L 23/50 327/595 |
| 2018/0096971 A1* | 4/2018 | Pappu | H01L 25/18 |
| 2019/0333892 A1* | 10/2019 | Gaide | H01L 25/18 |

* cited by examiner

*Primary Examiner* — David E Martinez
(74) *Attorney, Agent, or Firm* — Patterson + Sheridan, LLP

(57) ABSTRACT

A 3D stacked device includes a plurality of semiconductor chips stacked in a vertical direction. The semiconductor chips each include a plurality of portions grouped into slivers according to the column they lie in. Each of the portions further includes a plurality of blocks grouped into sub-slivers and interconnected by inter-block bridges. A block that must be functional on the bottommost chip of the 3D stacked device is configured to bypass a neighboring nonfunctional block on the same chip by using a communication path of an inter-block bridge to a neighboring functional block that is in the same sub-sliver as the non-functional block but in a different chip. So long as only one of the blocks in a sub-sliver is nonfunctional, the inter-block bridges permit the other blocks in the sub-sliver to receive and route data.

20 Claims, 8 Drawing Sheets

REDUNDANCY SCHEME FOR ACTIVATING CIRCUITRY ON A BASE DIE OF A 3D STACKED DEVICE

TECHNICAL FIELD

Examples of the present disclosure generally relate to providing redundancy in a three-dimensional (3D) stacked device containing a plurality of semiconductor chips.

BACKGROUND

In a 3D stacked device, semiconductor chips (or dies) are often replicated in the Z dimension. While each semiconductor chip in a 3D stacked device may be identical and interchangeable, the bottommost chip may include blocks (e.g., circuitry) that are only useable in that chip. For these blocks, even though identical circuitry is available in the upper layers, they cannot be used to enable redundancy if the counterpart circuitry in the bottommost chip is nonfunctional. In other words, these blocks must be functional in the bottommost chip. For instance, (input/output) I/O blocks, gigabit transceiver (GT) blocks, and processor subsystem (PS) blocks may connect to fabric regions around their edges. Also, hardware intellectual property (hard IP) blocks may not have through silicon vias (TSVs) inserted in them and thus can only be used on the base layer. Since the I/O and GT blocks will be connected directly to the package, their counterparts (e.g., the replicated I/O and GT blocks) on the upper layers are not utilized during normal operation. If a defect occurs in a fabric region that connects to an I/O or GT block, that I/O or GT block may no longer have a functional fabric interface for transferring data, rendering the block and the corresponding portion of the device unreachable and unusable.

SUMMARY

Techniques for providing redundancy in a 3D stacked device containing at least one redundant logical layer are described.

According to one aspect, there is provided a 3D stacked device that includes a plurality of semiconductor chips stacked vertically on each other, where each of the plurality of semiconductor chips is logically divided into a same of number of portions, where a respective first portion from each of the plurality of semiconductor chips in a column are grouped together to form a first sliver, where each of the first portions in the first sliver comprises a first block and a second block coupled to the first block through an inter-block bridge, where the respective first block from each of the plurality of semiconductor chips in a first sub-column are grouped together to form a first sub-sliver, where the first blocks in the first sub-sliver comprise an active first block, where the respective second block from each of the plurality of semiconductor chips in a second sub-column are grouped together to form a second sub-sliver, wherein the second blocks in the second sub-sliver comprise an active second block and a deactivated second block, where a communication path of the inter-block bridge is configured to route data from the active first block in the first sub-sliver to the active second block in the second sub-sliver, and where the active first block is in a same semiconductor chip as the deactivated second block but in a different semiconductor chip from the active second block.

According to another aspect, there is a 3D stacked device that includes a plurality of semiconductor chips stacked vertically on each other where each of the plurality of semiconductor chips comprises a first block and a second block coupled to the first block through an inter-block bridge, where the respective first block from each of the plurality of semiconductor chips in a first column are grouped together to form a first sub-sliver of a sliver, where the first blocks in the first sub-sliver comprise an active first block, where the respective second block from each of the plurality of semiconductor chips in a second column are grouped together to form a second sub-sliver of the sliver, where the second blocks in the second sub-sliver comprise an active second block and a deactivated second block, where a communication path of the inter-block bridge is configured to route data from the active first block in the first sub-sliver to the active second block in the second sub-sliver, and where the active first block is in a same semiconductor chip as the deactivated second block but in a different semiconductor chip from the active second block.

According to another aspect, there is a method for configuring a 3D stacked device including a plurality of semiconductor chips stacked vertically on each other. The method includes testing a plurality of blocks in each of the plurality of semiconductor chips, where the plurality of blocks in each of the plurality of semiconductor chips comprises a first block and a second block coupled to the first block through an inter-block bridge, where the respective first block from each of the plurality of semiconductor chips in a first column are grouped together to form a first sub-sliver of a sliver, where the first blocks in the first sub-sliver comprise an active first block, where the respective second block from each of the plurality of semiconductor chips in a second column are grouped together to form a second sub-sliver of the sliver. The method also includes identifying at least one nonfunctional block in the second sub-sliver, where the second sub-sliver comprises an active second block and the at least one nonfunctional block. The method further includes configuring a communication path of the inter-block bridge to route data from the active first block in the first sub-sliver to the active second block in the second sub-sliver, where the active first block is in a same semiconductor chip as the at least one nonfunctional block but in a different semiconductor chip from the active second block.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
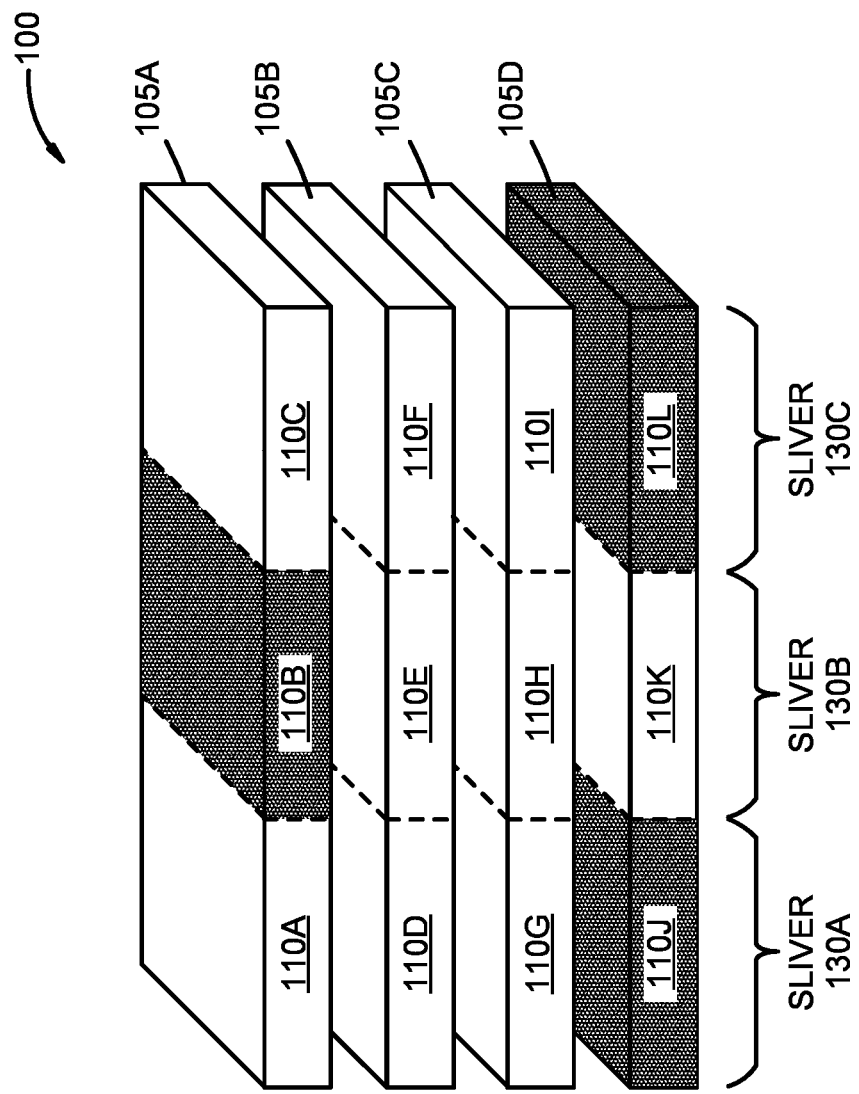
FIG. 1 illustrates a 3D stacked device having a redundant layer, according to an example.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive explanation of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples herein describe techniques for forming 3D stacked devices that include at least one redundant layer for activating circuitry on a base die. The 3D stacked devices include a plurality of semiconductor chips stacked in a vertical direction such that each chip is bonded to a chip above, below, or both in the stack. In one embodiment, each chip is the same (e.g., having the same circuitry arranged in the same configuration in the chip). The chips may include, but are not limited to, field programmable gate arrays (FPGAs), memory devices (e.g., DRAM or SRAM chips), processors, accelerators, systems on a chip (SoC), application specific integrated circuits (ASICs), and the like.

In one embodiment, the 3D stacked device provides a redundant logic layer by dividing the chips into a plurality of slivers which are interconnected by inter-chip bridges. For example, the 3D stacked device may include four stacked chips that are divided into three different slivers where each sliver includes a portion from each of the chips. The 3D stacked device further divides each sliver into a plurality of sub-slivers, each of which includes a block within a respective portion from each of the chips. The plurality of blocks within each sliver are interconnected by inter-block bridges. For example, at least one of the slivers includes four sub-slivers. For a block that must be functional in the bottommost chip, the inter-block bridges and a duplicated block in a redundant layer permit the block in the bottommost chip to bypass a neighboring nonfunctional block in the bottommost chip. So long as only one block in the neighboring sub-sliver has a defect (or is nonfunctional), the inter-block bridges permit at least one other blocks in the neighboring sub-sliver to communicate with (e.g., route data to) the block in the bottommost chip. In this redundancy scheme, multiple chips can have defects and still provide three logical layers that are equivalent to three fully functional chips in the stack in the corresponding sliver. Put differently, although more than one of the four chips in the stack may include nonfunctional blocks, so long as the blocks are in different sub-slivers, the inter-block bridges can couple together the chips such that it appears to an outside application that the 3D stacked device has three fully functional chips in the corresponding sliver.

The 3D stacked device described herein has several advantages over existing devices since the blocks (e.g., having I/O and/or GT circuitry) that must be functional in the base die can communicate directly to not only the base die but also the die(s) above. As such, if a defect occurs in a fabric region in the base die next to the IO or GT circuitry, the fabric region(s) in the layer(s) above in the same column (e.g., the same sub-sliver) can still be used. So long as only one of the fabric regions in the same column is nonfunctional, the 3D stacked device having N+1 physical layers can be treated as a device with N functional layers.

FIG. 1 illustrates a 3D stacked device 100 having a redundant layer, according to an example. In this example, the 3D stacked device 100 includes four semiconductor chips 105A, 105B, 105C, and 105D (collectively referred to as "the chips 105") that are the identical or interchangeable. That is, the chips 105 may be four of the same FPGAS, memory devices, processors, SoC, ASICs, and the like. Although four chips are shown in FIG. 1, the 3D stacked device 100 may include more or less than four chips (e.g., two, three, five, or six chips). For clarity, the chips 105 are shown as being spaced apart, but in operation are bonded together to establish physical connections and communication paths between the chips. For example, solder bumps or other communication means can be used to enable the chips 105 to communicate. Further, the chips 105 may be encased in a protective material, e.g., an epoxy to provide further structural support and protection when being packaged.

Each of the chips 105 is divided into three portions. As shown in FIG. 1, the chip 105A includes portions 110A, 110B, and 110C, the chip 105B includes portions 110D, 110E, and 110F, the chip 105C includes portions 110G, 110H, and 110I, and the chip 105D includes portions 110J, 110K, and 110L. The portions 110A through 110L (collectively referred to as "the portions 110") illustrated in FIG. 1 are logical divisions of the chip rather than physical divisions. The portions 110 are then grouped into respective slivers 130A, 130B, and 130C (collectively referred to as "the slivers 130") according to the column they lie in. For example, the portion 110A in the chip 105A, the portion 110D in the chip 105B, the portion 110G in the chip 105C, and the portion 110J in the chip 105D form the sliver 130A. The portion 110B in the chip 105A, the portion 110E in the chip 105B, the portion 110H in the chip 105C, and the portion 110K in the chip 105D form the sliver 130B. The portion 110C in the chip 105A, the portion 110F in the chip 105B, the portion 110I in the chip 105C, and the portion 110L in the chip 105D form the sliver 130C. Because the chips 105 are identical, the circuitry and its arrangement in each portion 110 in the same sliver 130 is identical. That is, the portions 110A, 110D, 110G, and 110J include the same circuitry and arrangement, the portions 110B, 110E, 110H, and 110K include the same circuitry and arrangement, and so forth. As such, the portions 110 in the same sliver 130 may perform identical functions, and thus, can be considered as redundant portions. In one embodiment, the portions in different slivers may be different. For example, the portions 110A, 110D, 110G, and 110J in sliver 130A may be different than the portions 110B, 110E, 110H, and 110K in sliver 130B.

In one embodiment, every portion 110 in all the chips 105 is the same. That is, the portions 110A through 110L may include the same circuitry and arrangement, and the slivers 130 are identical to each other. For example, if the chips 105 are FPGAs, the portions 110 may include circuitry which is repeated four times in each chip 105. In another example, the portions 110 may each include a processor, the same set of programmable logic, or the same amount of memory cells.

The division between the portions 110 and slivers 130 may be based on any number of logical boundaries such as a boundary between two clock domains, a boundary between two voltage domains, a boundary between two different types of circuitry or logic blocks, and the like. Although not shown here, the chips 105 include inter-chip bridges disposed at the boundary between each portion 110 in the chips 105 which enable the portions to communicate with a neighboring portion 110 in the same chip 105 or to a portion in a neighboring chip 105.

As illustrated in FIG. 1, the portions 110B, 110J, and 110L of the chips 105 are deactivated or are nonfunctional. In this example, during operation, the portions 110B, 110J, and 110L are not used while the portions 110A, 110B, 110C, 110D, 110E, 110H, 110I, 110J, and 110L are used. The deactivated portions 110 may be deactivated because they are nonfunctional (e.g., due to a manufacturing defect) or because they are redundant. For example, the portion 110L may include a manufacture defect that makes it nonfunctional; however, the portions 110B and 110J may be functional but are deactivated because they are redundant. That is, although the 3D stacked device 100 includes four chips 105, if any one of the chips 105 includes a nonfunctional portion 110, the 3D stacked device 100 performs as if it includes three fully functional chips 105. Put differently, although the 3D stacked device 100 includes four chips 105, it may be advertised as having at least three functional chips 105 and one redundant chip 105. If during testing, all the portions 110 in all the chips 105 are functional, then all the portions 110 may be active.

For simplicity, it is assumed that the deactivated portions 110 in FIG. 1 include manufacturing defects that make these portions nonfunctional. For example, after the chips 105 are bonded together, testing the chips 105 indicates that the portions 110B, 110J, and 110L are nonfunctional. Thus, unlike other redundancy schemes where N+1 redundancy is achieved only when a single chip has an error, here, three or four of the chips 105 can include errors and still function as three fully functional chips. Because none of the slivers 130 have more than one nonfunctional or deactivated portion, this means each sliver 130 has three functional or active portions 110. As described in detail below, the three active portions in each sliver 130 can be interconnected using the inter-chip bridges so that the device 100 performs equivalent to a device that has three fully functional chips (e.g., three chips with no nonfunctional or deactivated portions). That is, the portions 110A, 110D, and 110G in the sliver 130A are communicatively coupled to the active portions 110E, 110H, and 110K in the sliver 130B which in turn are communicatively coupled to the active portions 110C, 110F, and 110I in the sliver 130C. Because the portions 110 in each sliver are homogeneous, it does not matter which three of the four portions 110 are active (so long as they are functional). For example, to the perspective of the portion 110K, it does not matter whether it transmits and receives data with the portion 110L (which is in the same chip 105D) or the portion 110I (which is in the neighboring lower chip 105C). Thus, the active portions 110 in FIG. 1 can be communicatively coupled to perform the same function as three fully functional chips 105.

Figure 2:
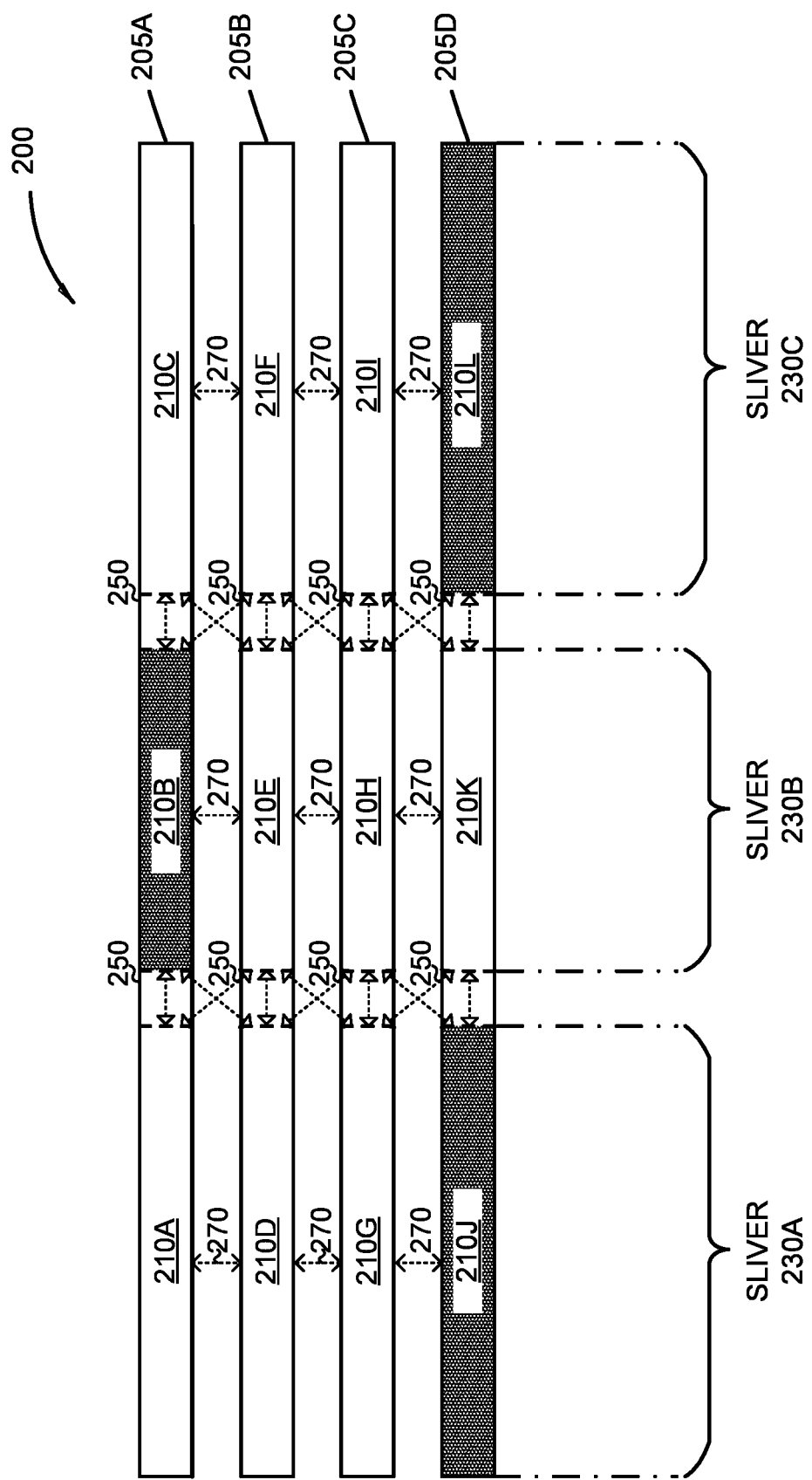
FIG. 2 illustrates a 3D stacked device having a redundant layer, according to an example.

FIG. 2 is a 3D stacked device 200 having a redundant layer, according to an example. FIG. 2 illustrates a side view or a cross section of the 3D stacked device 200 which illustrates respective inter-chip bridges 250 between each of portions 210A through 210L (collectively referred to as "the portions 210"). In this example, the 3D stacked device 200 includes four semiconductor chips 205A, 205B, 205C, and 205D (collectively referred to as "the chips 205") that are the identical or interchangeable. In this example, the semiconductor chips 205A, 205B, 205C, and 205D may substantially correspond to the semiconductor chips 105A, 105B, 105C, and 105D, respectively, as shown in FIG. 1.

It is noted that, different from the chips 105 in FIG. 1, the logical division of the chips 205 into the portions are different. For example, rather than the slivers having the same widths (or the same sized portions), the slivers 230A, 230B, and 230C have different sized portions. Like in the 3D stacked device 100 in FIG. 1, the portions in each sliver 230 may be the same (e.g., having the same circuitry and arrangement), but the slivers 230 may include different portions. That is, the circuitry in the portions 210 in the respective slivers may be different. For example, the portions 210A, 210D, 210G and 210J in the sliver 230A may include processors and associated memory while the portions 210B, 210E, 210H, and 210K in the sliver 230B may include programmable logic arranged in one or more configuration logic blocks. In addition, the sliver 230C may include different circuitry from those in the slivers 230A and 230B. In this example, the slivers 230A, 230B, and 230C are heterogeneous although the respective portions 210 within each of the slivers 230 are homogeneous. Further, the boundaries between the portions 210 and slivers 230 may be based on any number of logical boundaries such as a boundary between two clock domains, a boundary between two voltage domains, a boundary between two different types of circuitry, and the like.

As illustrated in FIG. 2, the double-headed dotted arrows indicate communication paths that can be facilitated by the inter-chip bridges 250 although only one of those paths may ultimately be selected. Put differently, the inter-chip bridges 250 may include circuitry and electrical paths (e.g., traces and vias) that permit each portion 210 to communicate with a neighboring portion 210 in the same chip and at least one neighboring portion in another chip 205. For example, the inter-chip bridge 250 between the portion 210A and 210B permits the portion 210A to communicate with the portion 210B which is in the same chip 205A as well as the portion 210E which is the different chip 205B. This same inter-chip bridge 250 permits the portion 210B to communicate with either the portion 210A in the chip 205A or the portion 210D in the chip 205B. The inter-chip bridge 250 between the portion 210D and the portion 210E permits the portion 210D to communicate with the portion 210E in the same chip 205B, the portion 210B in the upper chip 205A, or the portion 210H in the lower chip 205C. That same inter-chip bridge 250 permits the portion 210E to communicate with the portion 210D in the same chip 205B, the portion 210A in the upper chip 205A, or the portion 210G in the lower chip 205G. In this embodiment, the inter-chip bridges 250 are bi-directional and permit data to flow in both directions.

In addition to the communication paths provided by the inter-chip bridges 250, the 3D stacked device 200 includes vertical communication paths 270 that permit portions 210 in the same sliver to communicate. That is, while the inter-chip bridges 250 permit portions in one sliver to communicate with portions in a neighboring sliver (whether on the same chip or a different chip or chips), the vertical communication paths 270 permit the portions 210 in the same sliver to communicate. In one embodiment, the vertical communication paths 270 are unaffected by the deactivated portions 210.

For example, if the portion 210J is inactive in FIG. 2, the upper portions 210A, 210D and 210G can still use the vertical communication paths 270 to communicate with each other. For example, the vertical communication paths 270 may be passive vias that extend through all the portions 210A, 210D, 210G, and 210J. Thus, data transmitted on the vias by one of the portions 210 reaches the other two portions 210 regardless if one of those portions 210 is deactivated. In another example, the portions 210 may include separate receive and drive circuitry for relaying data using the vertical communication paths 270 which is unaffected when a portion 210 is deactivated. For example, if the portion 210J is deactivated, the driver and receiver circuitry for the paths 270 in the portion 210J may still be operational so that the portions 210A, 210D, and 210G can communicate using the vertical communication paths 270. Thus, not all of the circuitry in a deactivated portion 210 may be unused.

Similar to the 3D stacked device 100 in FIG. 1, the portions 210B, 210J, and 210L of the chips 205 are deactivated or are nonfunctional. However, so long as only one of the portions in each of the slivers 230 is deactivated, the 3D stacked device 200 can function the same as three fully functional chips 205. Being able to divide the chips 205 into slivers 230 increases the chance that each sliver contains at most one nonfunctional or deactivated portion. However, forming additional slivers 230 may be limited by the number of suitable boundaries for dividing the slivers 230, as well as the space used by adding the circuitry and structures for the inter-chip bridges at those boundaries.

Figure 3A:
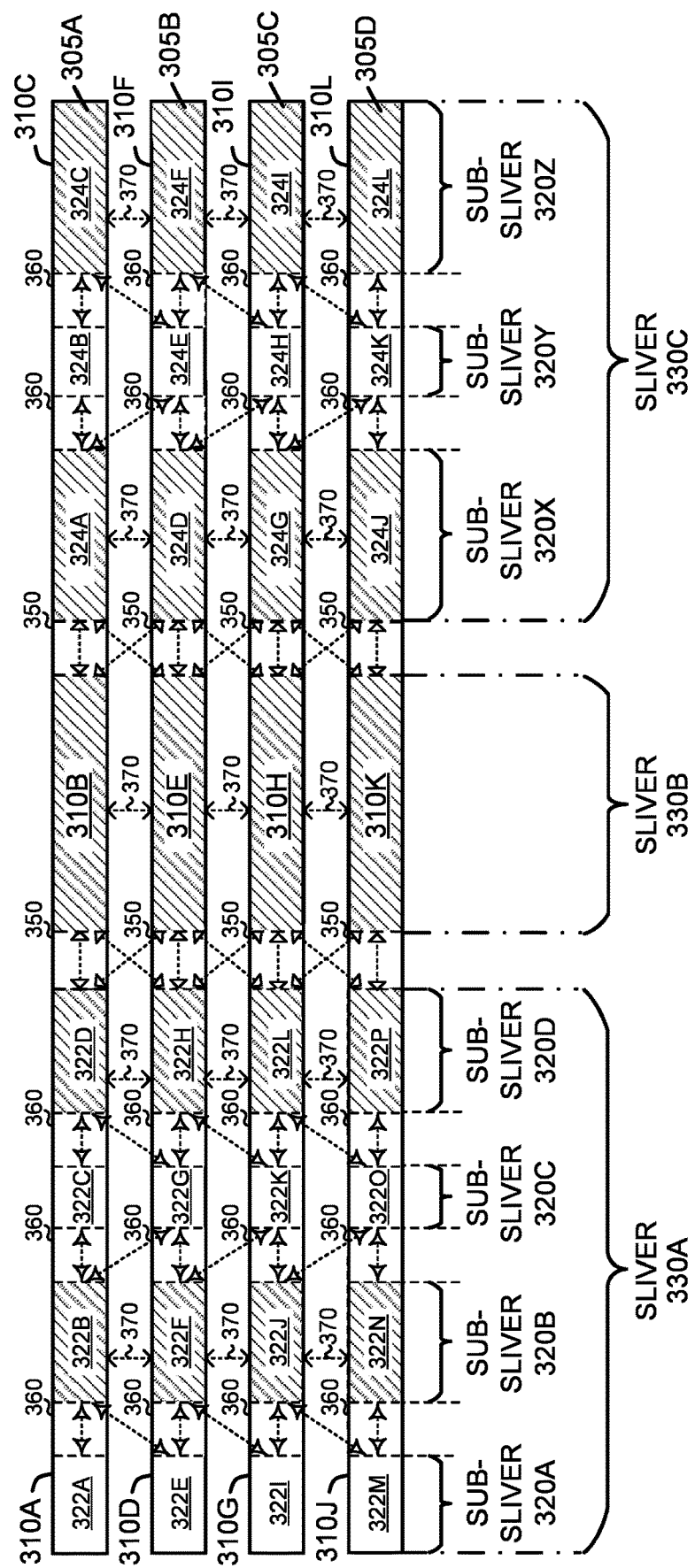
FIGS. 3A, 3B, and 3C illustrate a 3D stacked device having inter-block bridges, inter-chip bridges, and a redundant layer for avoiding at least one nonfunctional block in the 3D stacked device, according to an example.
Figure 3B:
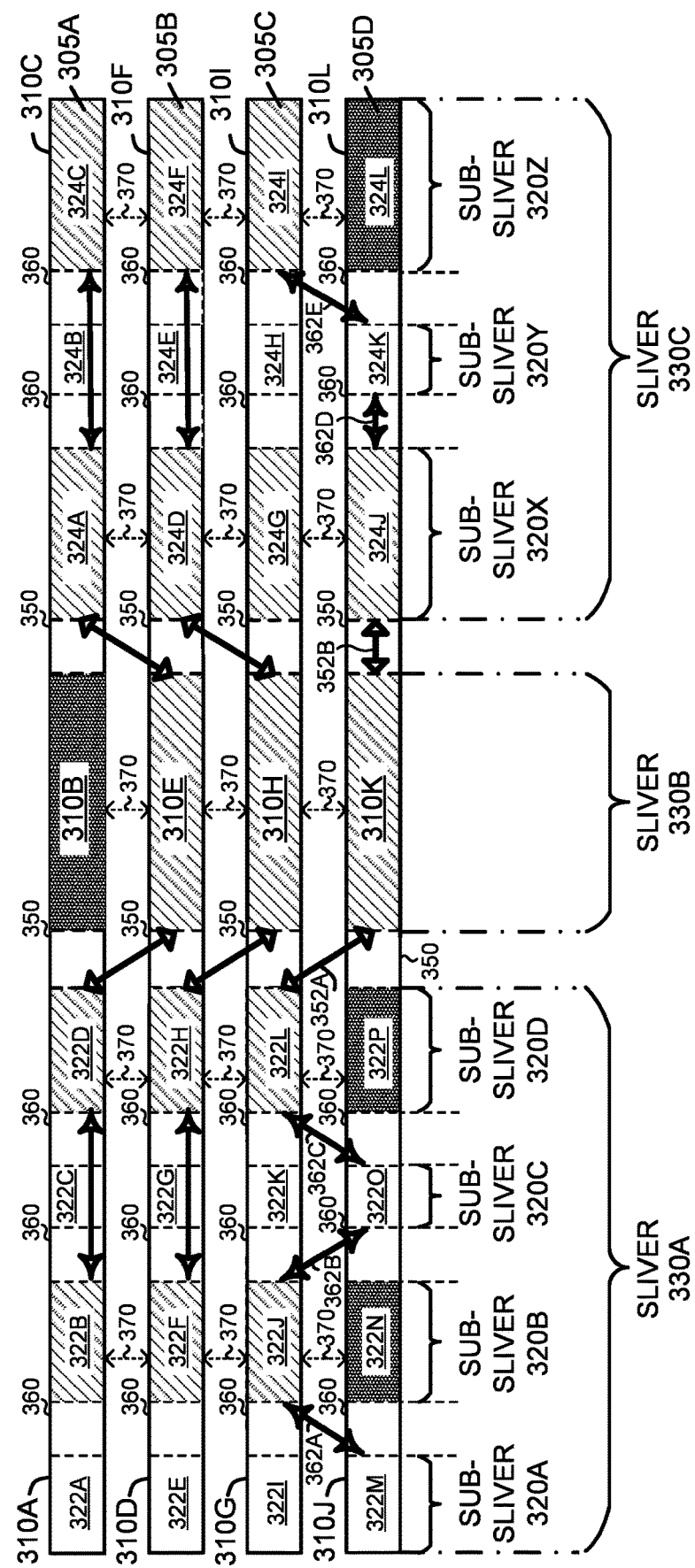
Figure 3C:
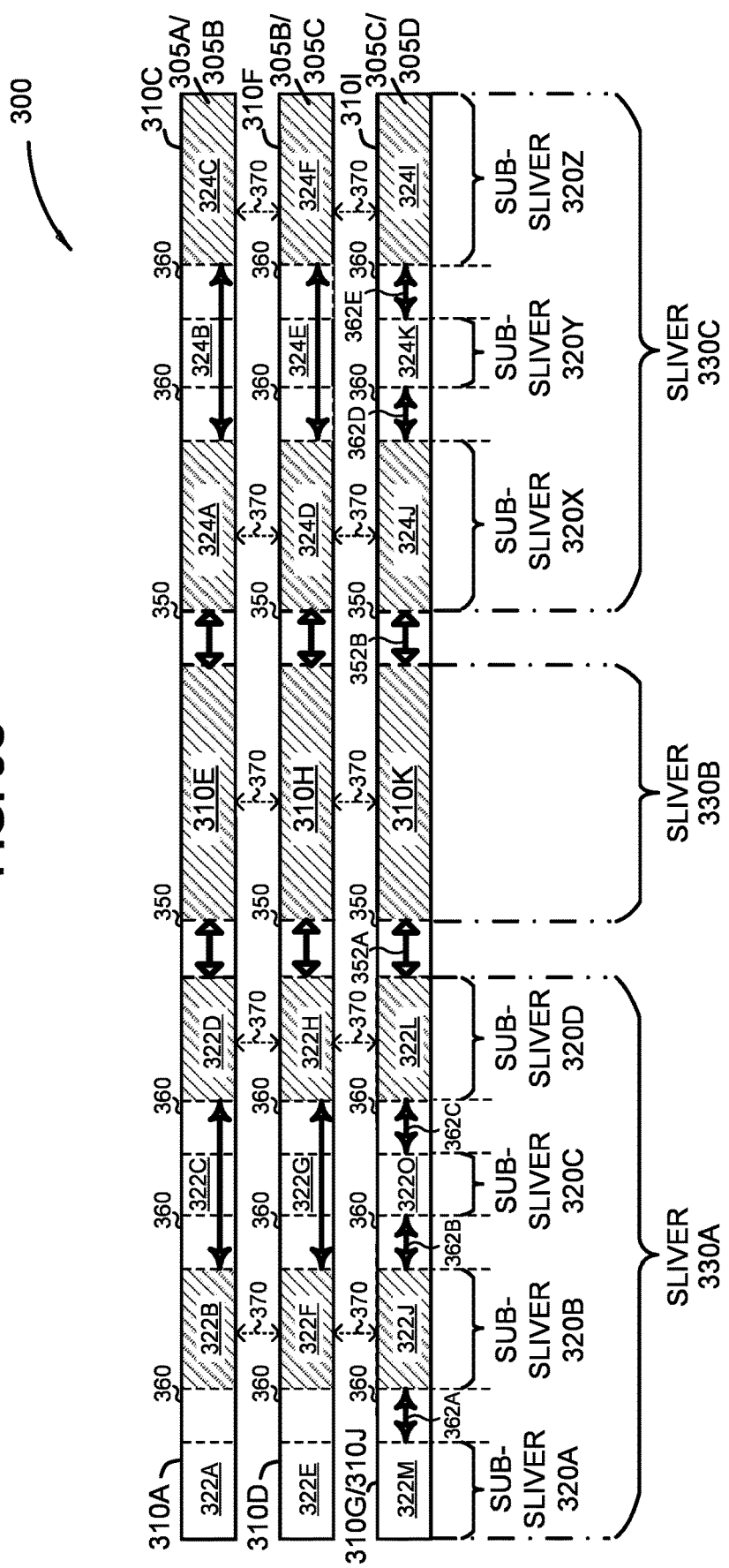

FIGS. 3A, 3B, and 3C illustrate a 3D stacked device 300 having inter-block bridges, inter-chip bridges, and a redundant layer for avoiding at least one nonfunctional block in the 3D stacked device, according to an example.

FIG. 3A illustrates a side view or a cross section of the 3D stacked device 300 having four semiconductor chips 305A, 305B, 305C, and 305D (collectively referred to as "the chips 305"). The 3D stacked device 300 also includes respective inter-chip bridges 350 between each of portions 310A through 310L (collectively referred to as "the portions 310"), and respective inter-block bridges 360 between each of blocks 322A through 322P (collectively referred to as "the blocks 322") and between each of the blocks 324A through 324L (collectively referred to as "the blocks 324"). Specifically, FIG. 3A illustrates the state of the 3D stacked device 300 before determining which of the blocks 322 and 324 are nonfunctional, and thus, should be deactivated.

In this example, each of the chips 305 is divided into three portions. As illustrated in FIG. 3A, the chip 305A includes portions 310A, 310B, and 310C. The chip 305B includes portions 310D, 310E, and 310F. The chip 305C includes portions 310G, 310H, and 310I. The chip 305D includes portions 310J, 310K, and 310L. The portions 310 illustrated in FIG. 3 are logical divisions of the chip rather than physical divisions. The portions 310 are then grouped into respective slivers 330 according to the column they lie in. For example, the portion 310A in the chip 305A, the portion 310D in the chip 305B, the portion 310G in the chip 305C, and the portion 310J in the chip 305D form the sliver 330A. The portion 310B in the chip 305A, the portion 310E in the chip 305B, the portion 310H in the chip 305C, and the portion 310K in the chip 305D form the sliver 330B. The portion 310C in the chip 305A, the portion 310F in the chip 305B, the portion 310I in the chip 305C, and the portion 310L in the chip 305D form the sliver 330C. Because the chips 305A, 305B, 305C, and 305D are the identical chips, the circuitry and its arrangement in each portion 310 in the same sliver 330 is identical or interchangeable. For example, the portions 310A, 310D, 310G, and 310J include the same circuitry and arrangement, the portions 310B, 310E, 310H, and 310K include the same circuitry and arrangement, and so forth. As such, the portions 310 in the same sliver 330 may perform identical functions, and thus, can be considered as redundant portions.

As further illustrated in FIG. 3A, each of the portions 310A, 310D, 310G, and 310J in the sliver 330A is divided into four blocks. For example, the portion 310A in the chip 305A includes blocks 322A, 322B, 322C, and 322D. The portion 310D in the chip 305B includes blocks 322E, 322F, 322G, and 322H. The portion 310G in the chip 305C includes blocks 322I, 322J, 322K, and 322L. The portion 310J in the chip 305D includes blocks 322M, 322N, 322O, and 322P.

The blocks 322 in the sliver 330A are grouped into respective sub-slivers 320A, 320B, 320C, and 320D according to the column they lie in. For example, the block 322A in the portion 310A, the block 322E in the portion 310D, the block 322I in the portion 310G, and the block 322M in the portion 310J form the sub-sliver 320A. The block 322B in the portion 310A, the block 322F in the portion 310D, the block 322J in the portion 310G, and the block 322N in the portion 310J form the sub-sliver 320B. The block 322C in the portion 310A, the block 322G in the portion 310D, the block 322K in the portion 310G, and the block 322O in the portion 310J form the sub-sliver 320C. The block 322D in the portion 310A, the block 322H in the portion 310D, the block 322L in the portion 310G, and the block 322P in the portion 310J form the sub-sliver 320D.

Because the chips 305A, 305B, 305C, and 305D are identical chips, the circuitry and its arrangement in each block 322 in the same sub-sliver 320 is identical. For example, the blocks 322A, 322E, 322I, and 322M in the sub-sliver 320A include the same circuitry and arrangement, the blocks 322B, 322F, 322J, and 322N in the sub-sliver 320B include the same circuitry and arrangement, and so forth. As such, the blocks 322 in the same sub-sliver 320 may perform identical functions, and thus, can be considered as redundant blocks.

In one example, the blocks 322A, 322E, 322I, and 322M in the sub-sliver 320A may include GT circuitry, while the blocks 322B, 322F, 322J, and 322N in the sub-sliver 320B may include programmable logic circuitry for transferring data (e.g., fabric circuitry). In addition, the blocks 322C, 322G, 322K, and 322O in the sub-sliver 320C may include hard IP circuitry, while the blocks 322D, 322H, 322L, and 322P in the sub-sliver 320D may include programmable logic circuitry for transferring data (e.g., fabric circuitry).

Similarly, the blocks 324 in the sliver 330C are also grouped into respective sub-slivers 320X, 320Y, and 320Z according to the column they lie in. For example, the block 324A in the portion 310C, the block 324D in the portion 310F, the block 324G in the portion 310I, and the block 324J in the portion 310L form the sub-sliver 320X. The block 324B in the portion 310C, the block 324E in the portion 310F, the block 324H in the portion 310O, and the block 324K in the portion 310L form the sub-sliver 320Y. The block 324C in the portion 310C, the block 324F in the portion 310F, the block 324I in the portion 310O, and the block 324L in the portion 310L form the sub-sliver 320Z.

Because the chips 305A, 305B, 305C, and 305D are identical, the circuitry and its arrangement in each block 324 in the same sub-sliver 320 is also identical. For example, the blocks 324A, 324D, 324G, and 324J in the sub-sliver 320X include the same circuitry and arrangement, the blocks 324B, 324E, 324H, and 324K in the sub-sliver 320Y include the same circuitry and arrangement, and so forth. As such, the blocks 324 in the same sub-sliver 320 may perform identical functions, and thus, can be considered as redundant blocks.

In one example, the blocks 324A, 324D, 324G, and 324J in the sub-sliver 320X may include programmable logic circuitry for transferring data (e.g., fabric circuitry). The blocks 324B, 324E, 324H, and 324K in the sub-sliver 320Y may include vertical network-on-chip (VNOC) circuitry. The blocks 324C, 324F, 324O, and 324L in the sub-sliver 320Z may also include programmable logic circuitry for transferring data (e.g., fabric circuitry).

As illustrated in FIG. 3A, in addition to the inter-chip bridges 350 disposed at the boundary of each of the portions 310, the 3D stacked device 300 also includes inter-block bridges 360. Unlike the inter-chip bridges 350 which are each configured to steer an output of a portion in one of three directions (e.g., to the same chip, upper chip, or lower chip), the inter-block bridges are each configured to steer an output of a block in one of two directions (e.g., to the same chip or another (upper or lower) chip). In addition, in this embodiment, the inter-block bridges 360 are configured to connect blocks having different kinds of circuitry (e.g., hard IP to fabric, GT to fabric, PS to fabric, and etc.). In another embodiment, the inter-block bridges 360 may be configured to connect blocks having the same kind of circuitry (e.g., hard IP to hard IP, GT to GT, PS to PS, fabric to fabric, and etc.). In some embodiments, the inter-chip bridges 350 and the inter-block bridges 360 steer different types of connections. For example, the inter-chip bridges 350 may steer signals that connect one interconnect tile to another, while the inter-block bridges 360 may steer signals that connect an interconnect tile to a non-interconnect block.

In this example, the inter-block bridges 360 allow communication between the blocks 322 in the sliver 330A, and between the blocks 324 in the sliver 330C (i.e., the slivers disposed on the periphery of the chips 305). The double-headed dotted arrows indicate communication paths that can be facilitated by the inter-block bridges 360 although only one of those (e.g., two) paths may ultimately be selected. Put differently, the inter-block bridges 360 include circuitry (e.g., logic-out or imux circuitry) and electrical paths (e.g., traces and vias) that permit each block 322 in the sliver 330A to communicate with either a neighboring block 322 in the same chip or a neighboring block in another chip 305, and permit each block 324 in the sliver 320C to communicate with either a neighboring block 324 in the same chip or a neighboring block in another chip 305. For example, the inter-block bridge 360 between the blocks 322M and 322N permits the block 322M to communicate with the block 322N which is in the same chip 305D as well as the block 322J which is in the different chip 305C. Also, the inter-block bridge 360 between the blocks 322J and 322K permits the block 322J to communicate with the block 322K which is in the same chip 305C, and permits the block 322J to communicate with the block 322O which is in the different chip 305D. The inter-block bridge 360 between the blocks 322J and 322K also permits the block 322K to communicate with the block 322J which is in the same chip 305C, and permits the block 322K to communicate with the block 322F which is in the different chip 305B. It is noted that the inter-block bridges 360 are bi-directional and permit data to flow in both directions.

In this example, the 3D stacked device 300 may include blocks that are only useable in the chip 305D, which may also be referred to as the bottommost chip or base layer of the 3D stacked device 300. Put differently, certain blocks in the 3D stacked device 300 are only active on the bottommost chip 305D. For example, while each of the blocks 322A, 322E, 322I, and 322M in sub-sliver 320A may include identical I/O and/or GT circuitry, only the I/O and/or GT circuitry in the block 322M in the bottommost chip 305D may be used for the 3D stacked device 300 because the I/O and/or GT circuitry will be connected directly to a substrate or package below. During normal operation, only the block 322M in the sub-sliver 320A is activated, and the remaining the blocks 322A, 322E, and 322I in the sub-sliver 320A are deactivated. Also, while each of the blocks 322C, 322G, 322K, and 322O in the sub-sliver 320C may include identical hard IP circuitry, only the hard IP circuitry in the block 322O in the bottommost chip 305D may be used for the 3D stacked device 300 because, e.g., it is undesirable for hard IP circuitry to have through silicon vias (TSVs) inserted therein. During normal operation, only the block 322O in the sub-sliver 320C is activated, and the remaining the blocks 322C, 322G, and 322K in the sub-sliver 320C are deactivated.

In this example, the blocks in the sub-slivers 320B and 320D may include blocks having programmable logic circuitry (e.g., fabric regions) interfacing the respective blocks in the sub-slivers 320A and 320C. If a defect occurs in the block 322N in the sub-sliver 320B, the block 322N is nonfunctional and deactivated. Since the block 322M includes circuitry (e.g., having I/O and/or GT circuitry) that is only usable on the bottommost chip 305D, when the block 322N is nonfunctional, the circuitry in the block 322M would no longer have a functional interface (e.g., a fabric interface) with the block 322N in the chip 305D to transfer data. In addition, as the block 322N also communicates with the block 322O, if the block 332N is nonfunctional, since the block 322O also includes circuitry (e.g., hard IP circuitry) that is only usable on the bottommost chip 305D, then the circuitry would also no longer have a functional interface (e.g., a fabric interface) with the block 322N in the chip 305D to transfer data. As discussed with reference to FIG. 3B below, absent of the inter-block bridges 360 and a duplicated or identical block 332J above the block 322N, the blocks 322M and 322O would not have a data path to connect to each other or other blocks in the 3D stacked device 300, when the block 322N is nonfunctional.

In addition to the communication paths provided by the inter-block bridges 360, the 3D stacked device 300 further includes vertical communication paths 370 that permit blocks in the same sub-sliver to communicate. That is, while the inter-block bridges 360 permit blocks in one sub-sliver to communicate with blocks in a neighboring sub-sliver (whether on the same chip or a different chip or chips), the vertical communication paths 370 permit the blocks 322 and 324 in their respective same sub-sliver to communicate. In one example, the vertical communication paths 370 in FIG. 3 may substantially correspond to the vertical communication paths 270 in FIG. 2.

In one embodiment, the vertical communication paths 370 may be unaffected by the deactivated blocks 322 or the deactivated blocks therein. For example, although the block 322N is deactivated or inactive in the sub-sliver 320B, the blocks 332B, 332F, and 322J can still use the vertical communication paths 370 to communicate. The vertical communication paths 370 may be passive vias that extend through all the blocks 332B, 332F, 322J, and 322N in the sub-sliver 320B. Thus, data transmitted on the vias by one of the blocks 322 may reach the other three blocks 322 regardless if one of those blocks 322 is deactivated. In another example, the blocks 322 may include separate receive and drive circuitry for relaying data using the vertical communication paths 370 which is unaffected when a block 322 is deactivated. For example, although the block 322N is deactivated, the driver and receiver circuitry for the communication paths 370 in the block 322N may still be operational so that the blocks 332B, 332F, and 322J can communicate using the vertical communication paths 370. Thus, not all of the circuitry in a deactivated block may be unused.

It is noted that, in this example, the vertical communication paths 370 are used for communications among the blocks 322 in the sub-slivers 320B and 320D which contain programmable logic circuitry (e.g., fabric regions), and among the blocks 324 in the sub-slivers 320X and 320Z which contain programmable logic circuitry (e.g., fabric regions). The portions 310B, 310E, 310H, and 310K also include vertical communication paths 370 to communicate with each other. In another example, the vertical communication paths 370 may be used for communications among the blocks in each of the sub-slivers 320A, 320C, and 320Y.

FIG. 3B illustrates the state of the inter-block bridges 360 and inter-chip bridges 350 when the 3D stacked device 300 is configured and one or more nonfunctional or deactivated blocks have been identified. In this example, the 3D stacked device 300 bypasses at least one nonfunctional block in the bottom layer, by utilizing inter-block bridges 360 and a duplicated block in another layer, in order to route data between blocks that are functional only on the bottom layer (i.e., the bottom chip). However, it should be understood that embodiments of the present disclosure are not limited to utilizing inter-block bridges and a duplicated block to bypass a nonfunctional block in the bottommost layer, as the redundancy scheme can be applied to any layer in a 3D stacked device.

In FIG. 3B, the solid double-headed arrows indicate the actual communication paths established by, for example, the inter-block bridges 360 and the inter-chip bridges 350 rather than the potential communication paths illustrated by the dotted arrows.

In this example, the blocks 322N and 322P in the sliver 330A are identified as nonfunctional and deactivated (e.g., due to manufacturing defects which affect their operability). When the block 322N is nonfunctional and deactivated, the block 322N's neighboring blocks 322M (e.g., having I/O and/or GT circuitry) and 322O (e.g., having hard IP circuitry) do not have a functional interface for exchanging data with each other in the chip 305D. As discussed above, because the blocks 322M and 322O should be active in the chip 305D (e.g., the bottommost layer in the 3D stacked device 300), absent of the inter-block bridges 360 and duplicated functional blocks 322 (e.g., the blocks 322B, 322F, and 322J) in the upper chips, the nonfunctional block 322N would cause the blocks 322M and 322O to be unusable and/or unreachable.

In this example, the sub-sliver 320B (e.g., having programmable logic circuitry) includes at most one deactivated block 322. Thus, although the block 322N is nonfunctional and deactivated, the remaining blocks 322J, 322F, and 322B in the sub-sliver 320B, which include identical circuitry as the block 322N, may be used to perform the functions of the block 322N.

As illustrated in FIG. 3B, the block 322J in the chip 305C in sub-sliver 320B may be used, in conjunction with the inter-block bridges 360, to bypass the nonfunctional and deactivated block 322N. For example, the inter-block bridge 360 between the blocks 322M and 322N provides a path 362A which permits the block 322M in the chip 305D in the sub-sliver 320A to transmit data to, and receive data from, the block 322J in the chip 305C in the neighboring sub-sliver 320B. The inter-block bridge 360 between the blocks 322J and 322K provides a path 362B which permits the block 322J in the chip 305C in the sub-sliver 320B to transmit data to, and receive data from, the block 322O in the chip 305D in the neighboring sub-sliver 320C. As such, the inter-block bridges 360 and duplicated block 322J provide a communication path to allow data flow between the blocks 322M and 322O that avoids the nonfunctional and deactivated block 322N.

Similarly, when the block 322P is nonfunctional and deactivated, the block 322O (e.g., having hard IP circuitry) does not have a functional interface for exchanging data with a neighboring portion (e.g., the portion 310K) in the chip 305D. Because the block 322O should be active in the chip 305D (e.g., the bottommost layer in the 3D stacked device 300), absent of the inter-block bridges 360 and duplicated functional blocks 322 (e.g., the blocks 322D, 322H, and 322L) in the upper chips, the nonfunctional block 322P would cause the block 322O to be unusable or unreachable.

In this example, the sub-sliver 320D (e.g., having programmable logic circuitry) includes at most one deactivated block 322. Thus, although the block 322P is nonfunctional and deactivated, the remaining blocks 322D, 322H, and 322L in the sub-sliver 320D, which include identical circuitry as the block 322P, may be used to perform the functions of the block 322P.

As illustrated in FIG. 3B, the block 322L in the chip 305C in sub-sliver 320D may be used, in conjunction with one inter-block bridge 360 and one inter-chip bridge 350, to bypass the nonfunctional and deactivated block 322P.

For example, the inter-block bridge 360 between the blocks 322O and 322P provides a path 362C which permits the block 322O in the chip 305D in the sub-sliver 320C to transmit data to, and receive data from, the block 322L in the chip 305C in the neighboring sub-sliver 320D. The inter-chip bridge 350 between the portions 310G and 310H provides a communication path 352A which permits the block 322L of the portion 310G in the sliver 330A to transmit data to, and receive data from, the portion 310K in the chip 305D in the neighboring sliver 330B, assuming the portion 310K is active. As such, the inter-block bridge 360, duplicated block 322L, and inter-chip bridge 350 provide a communication path to allow data flow between the block 322O and the functional portion 310K in the sliver 330B that avoids the nonfunctional and deactivated block 322P.

In this example, in the chip 305C, the portion 310K in the sliver 330B and the block 324J in the portion 310L in the sliver 330C are both functional and active. Thus, the block 322L in the sliver 330A can transmit data to, and receive data from, the block 324J in the sliver 330C through the portion 310K in the sliver 330B and the inter-chip bridges 350 that provide communication paths 352A and 352B.

In another example, if the portion 310K is deactivated or nonfunctional, the inter-chip bridge 350 between portions 310G and 310H may couple the block 322L to the portion 310H in the chip 305C or the portion 310E in the upper chip 305B.

In another example, if the portion 310K is active and functional, but the block 324J in the portion 310L is deactivated or nonfunctional, the inter-chip bridge 350 between the portions 310K and 310L may couple the portion 310K in the chip 305D to the block 324G in the portion 310I in the upper chip 305C.

It is noted that, when the portions 310H and 310K are both active and functional, connecting the block 322L with the portion 310K rather than the portion 310H may be preferred as it may yield three logical layers if there is a defect (e.g., in the portion 310B or 310E) in the upper layers the sliver 330B.

As further illustrated in FIG. 3B, in the sliver 330C, the block 324K in the sub-sliver 320Y may include circuitry that is only useable in the chip 305D (e.g., the bottommost layer in the 3D stacked device 300). For example, while each of the blocks 324B, 324E, 324H, and 324K in the sub-sliver 320Y includes identical circuitry (e.g., having VNOC circuitry), only the circuitry in the block 324K in the bottommost chip 305D may be used for the 3D stacked device 300. In the sliver 330C, the inter-block bridge 360 between the blocks 324J and 324K provides a communication path 362D which permits the block 324J in the sub-sliver 320X to transmit data to, and receive data from, the block 324K in the neighboring sub-sliver 320Y in the chip 305D.

In this example, the block 324L is identified as nonfunctional and deactivated (e.g., due to a manufacturing defect which affects its operability). As a result, the block 324K cannot exchange data with the block 324L in the chip 305D. Because the block 324K needs to be active in the chip 305D (e.g., the bottommost layer in the 3D stacked device 300), absent of the inter-chip bridges 360 and duplicated functional blocks 324 (e.g., the blocks 3224C, 324F and 324I) in the upper chips, the nonfunctional block 324L would cause the block 324K to be unusable or unreachable.

In this example, the sub-sliver 320Z (e.g., having programmable logic circuitry) includes at most one deactivated block 324. Thus, although the block 324L nonfunctional and deactivated, the remaining blocks 324C, 324F, and 324I in the sub-sliver 320Z, which include identical circuitry as the block 324L, may be used to perform the functions of the block 324L.

As illustrated in FIG. 3B, the block 324I in the chip 305C in sub-sliver 320Z may be used, in conjunction with the inter-block bridge 360 between the blocks 324K and 324L, to bypass the nonfunctional and deactivated block 324L.

For example, the inter-block bridge 360 between the blocks 324K and 324L provides a path 362E which permits the block 324K in the chip 305D in the sub-sliver 320Y to transmit data to, and receive data from, the block 324I in the chip 305C in the neighboring sub-sliver 320Z. As such, the inter-block bridge 360 and duplicated block 324I provide a communication path to allow data flow between the blocks 324K and 324I that avoids the nonfunctional and deactivated block 324L.

In this example, the blocks 322A, 322E, and 322I in the sub-sliver 320A, the blocks 322C, 322G, and 322K in the sub-sliver 320C, and the blocks 324B, 324E, and 324H in the sub-sliver 320Y may be unused and deactivated, while their corresponding blocks 322M, 322O and 324K (e.g., having GTs, IOs, NOCs, and etc.) in the chip 305D are activated and functional. In addition, as illustrated in FIG. 3B, the portion 310B in the sliver 330B may be nonfunctional and deactivated.

In this example, although the blocks 322A and 322C are unused in the portion 310A, the blocks 322B and 322D may be functional to allow data to flow therebetween. In addition, data may flow between the blocks 322F and 322H while the blocks 322E and 322G in the portion 310D are unused. Similarly, in sliver 330C, data may flow between the blocks 324A and 324C and between the blocks 324D and 324F, while the blocks 324B and 324E are unused.

FIG. 3C is a logical view of the device illustrated in FIG. 3B, according to an example. FIG. 3C illustrates the flow of data through the portions 310 (including blocks 322 and 324) without illustrating the locations of the portions 310 in the chips.

As shown in FIG. 3C, the block 322M in the chip 305D in the sub-sliver 320A communicates with the block 322J in the chip 305C in the sub-sliver 320B through the communication path 362A using the inter-block bridge 360 between the blocks 322M and 322N. The block 322J in the chip 305C in the sub-sliver 320B communicates with the block 322O in the chip 305D in the sub-sliver 320C through the communication path 362B using the inter-block bridge 360 between the blocks 322J and 322K. The block 322O in the chip 305D in the sub-sliver 320C then communicates with the block 322L in the chip 305C in the sub-sliver 320D through the communication path 362C using the inter-block bridge 360 between the blocks 322O and 322P. The block 322L in the chip 305C in the sub-sliver 320D communicates with the portion 310K in the chip 305D in the sliver 330B through the communication path 352A using the inter-chip bridge 350 between the portions 310G and 310H. The portion 310K in the chip 305D in the sliver 330B communicates with the block 324J in the chip 305D in the sub-sliver 320X through the communication path 352B using the inter-chip bridge 350 between the portions 310K and 310L. The block 324J in the chip 305D in the sub-sliver 320X communicates with the block 324K in the chip 305D in the sub-sliver 320Y through the communication path 362D using the inter-block bridge 360 between the blocks 324J and 324K. The block 324K in the chip 305D in the sub-sliver 320Y communicates with the block 324I in the chip 305C in the sub-sliver 320Z through the communication path 362E using the inter-block bridge 360 between the blocks 324K and 324L.

As shown in FIG. 3C, the blocks 322B and 322D of the portion 310A in the chip 305A communicates with the portion 310E in the chip 305B, which in turn communicates with the blocks 324A and 324C of the portion 310C in the chip 305A. Also, the blocks 322F and 322H of the portion 310D in the chip 305B communicates with the portion 310H in the chip 305C, which in turn communicates with the blocks 324D and 324F of the portion 310F in the chip 305B.

As illustrated in FIG. 3C, the blocks and portions can be interconnected by the inter-block bridges 360 and inter-chip bridges 350 to establish three logical chips that function the same as three fully functional physical chips which may include the vertical communication paths 370 for permitting communication between certain blocks in the same sub-slivers and certain portions in the same slivers.

It should be noted that, in a top-down perspective, the inter-block bridges 360 may be situated around one or more edges of the 3D stacked device 300, as well as at boundaries (e.g., at GT, hard IP, and VNOC boundaries) of the blocks within each sliver.

Figure 4:
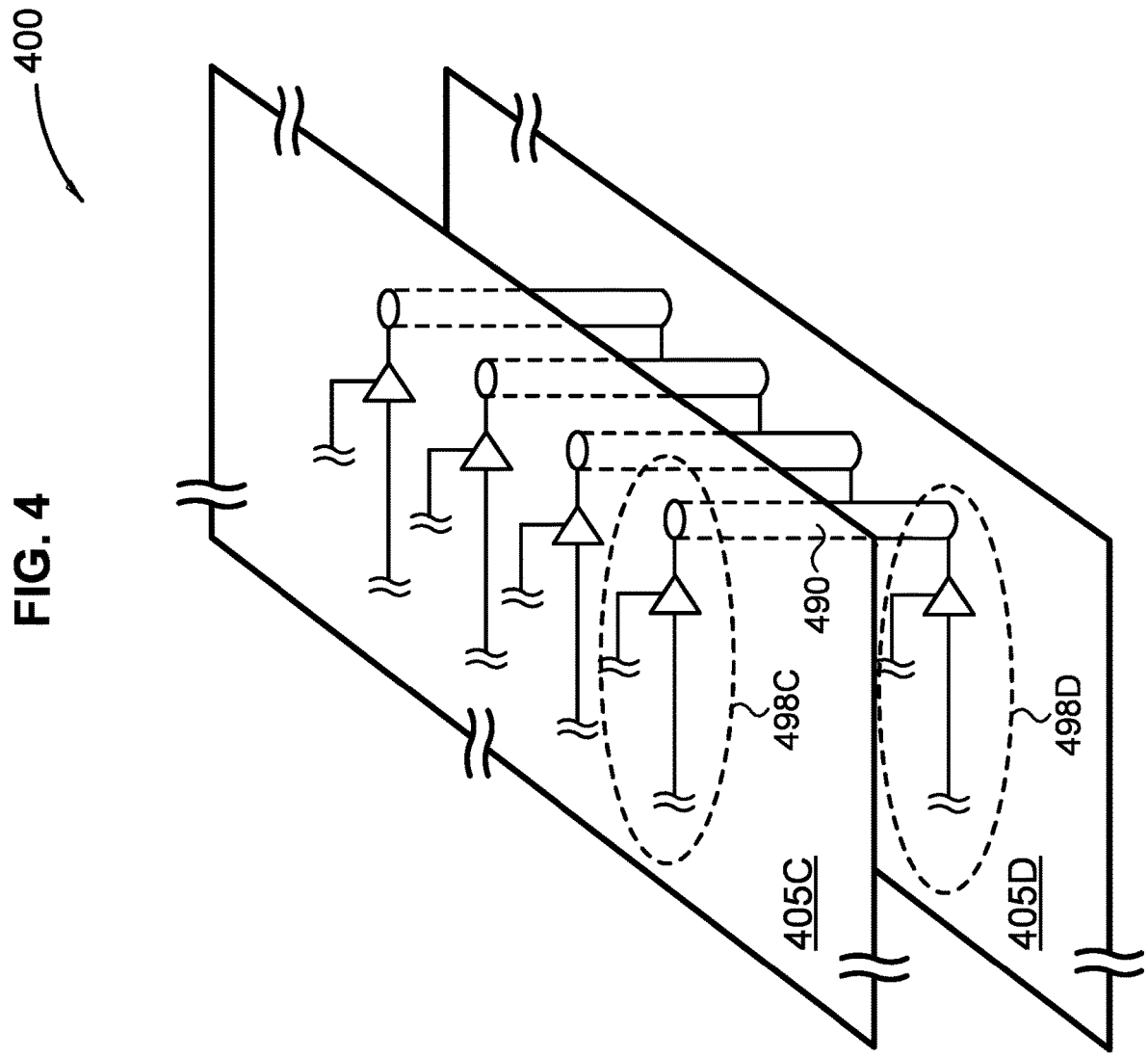
FIG. 4 illustrates a portion of a 3D stacked device in which the outputs of respective drivers in at least two semiconductor chips connected through interposers, according to an example.

FIG. 4 illustrates a portion of a 3D stacked device 400 having at least two semiconductor chips stacked vertically over each other, according to an example. In this example, the 3D stacked device 400 includes semiconductor chips 405C and 405D, each having a plurality of drivers (e.g., drivers 498C and 498D) for providing outputs to another semiconductor device or package. In one embodiment, the drivers may include inter-die drivers and/or receivers that are used to facilitate communication from one die to another within a package. For example, the drivers may include Laguna drivers.

In one embodiment, the semiconductor chips 405C and 405D may substantially correspond to the semiconductor chips 305C and 305D, respectively, as shown and described with reference to FIGS. 3A-3C. For example, the drivers 498 may be part of the programmable logic circuitry in the chips 305C and 305D (e.g., in the sub-sliver 320B/320D/320X/320Z or in the sliver 330B) in the 3D stacked device 300 in FIGS. 3A-3C. In an example, the interposer 490 may constitute one of the communication paths 370 between the chips 305C and 305D in FIGS. 3A-3C. It is noted that, in some embodiments, the drivers 498 and the interposers 490 may be more suitable for connecting the blocks in each of the sub-slivers 320B, 320D, 320X or 320Z than for connecting the blocks in each of the sub-sliver 320A, 320C, or 324K, because the blocks in the sub-sliver 320A, 320C, or 324K may include circuitry (e.g., GT blocks) that is more sensitive and less tolerate to the power required to drive the drivers 498.

According to this example, a defect in the chip 405D may cause the drivers in that layer to be unusable. However, the replicated drivers in the chip 405C or in any other vertically stacked chips (e.g., the chips 305A and 305B in FIGS. 3A-3C) can be used to drive the same connections through the corresponding interposers.

For example, when there is a defect in the chip 405D, the driver 498D cannot be driven to provide an output, for example to another semiconductor device or package. However, as the driver 498C in the chip 405C is identical to the driver 498D and their outputs are electrically shorted through the interposer 490, the driver 498C can be used to provide an output from the chip 405C. In other words, the outputs of the respective drivers on every layer of the 3D stacked device 400 are electrically shorted together, so that a failure on any die layer can still yield a device where the drivers can access the interposer.

In this example, the output connections are extended in three dimensions such that if the drivers on a given layer fail, another layer can be used to drive the same connections using identical drivers. Any interface in a fabric region (e.g., having programmable logic circuitry) that communicates with the interposer is indistinguishable from any layer. Among other advantages, the device 400 enables a 3D defect tolerance scheme which can protect the fabric in the base layer even when it connects to blocks that can only be activated on the base die by allowing these blocks to communicate with multiple die layers through one or more interposers.

Figure 5:
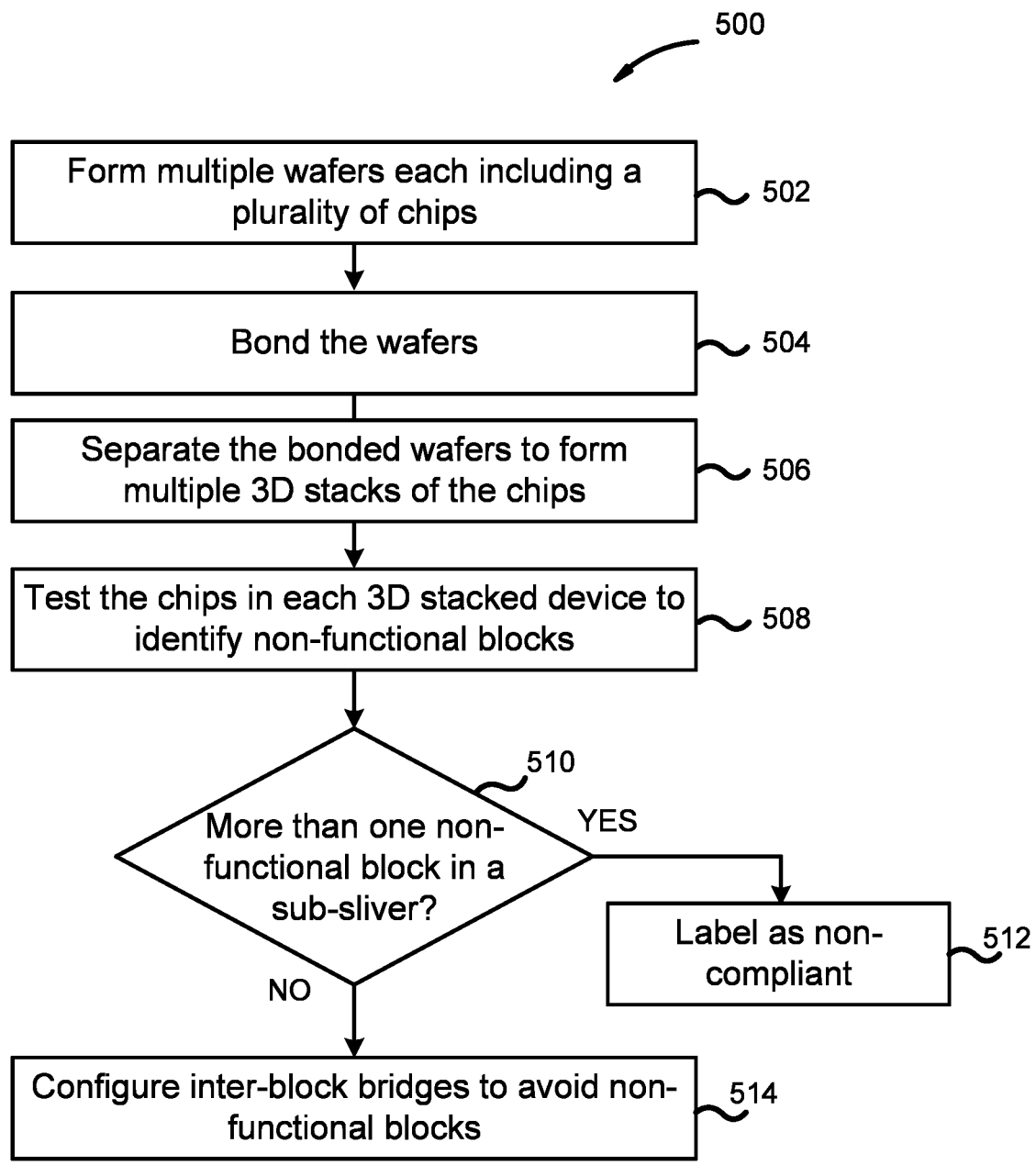
FIG. 5 is a flowchart for forming 3D stacked devices with a redundant layer, according to an example.

FIG. 5 is a flowchart of a method 500 for forming 3D stacked devices with a redundant layer, according to an example. In action 502, multiple wafers are formed that each include a plurality of chips. For example, each circular wafer can include tens or hundreds of different chips.

In action 504, the wafers are bonded together in a stack. That is, the wafers can be aligned such that a chip in the top wafer overlaps, and aligns with, a corresponding chip in the next wafer, and so forth. For example, solder bumps may be used to physically and communicatively couple the wafers together such that the chips in the different wafers can communicate. As discussed above, these solder bumps or connections can be used as part of the vertical communication paths 370 and the paths used by the inter-chip bridges 350 and inter-block bridges 360 to establish communication between portions and blocks in different chips 305 as shown in FIG. 3A.

In action 506, the bonded wafers are separated to form multiple 3D stacked devices. For example, the bonded wafers can be sawed or cut along the boundary between each of the chips in the wafers. Doing so results in multiple 3D stacked devices which each includes a column of stacked chips as shown in FIGS. 1-3B. As discussed above, the chips can be logically divided to form one or more of the slivers and sub-slivers.

In action 508, the chips in each of the 3D stacked devices are tested to identify nonfunctional blocks. In one embodiment, so long as one chip includes a nonfunctional block, a block from each sub-sliver (or sliver) is deactivated. Selecting which of the functional blocks in a sub-sliver to activate and deactivate is discussed in FIG. 6. However, in other embodiments, it may be possible to deactivate only the nonfunctional blocks such that some sub-slivers may contain only active blocks.

In action 510, the method 500 determines whether there is a sub-sliver that includes more than one nonfunctional block. For example, after reviewing the testing results, a testing apparatus or engineer can determine whether two or more blocks in the same sub-sliver (which would be on different chips) are nonfunctional. If so, the method 500 proceeds to action 512 where the 3D stacked device is labeled as non-compliant. For example, the 3D stacked devices may be guaranteed or advertised to have N+1 redundancy where each sub-sliver includes an extra block such the 3D stacked device can function as an 3D stacked device with N fully functional chips. However, if a device with N+1 redundancy has a sub-sliver with two or more nonfunctional blocks, than the device cannot function like it has N fully function chips. In one embodiment, the non-compliant device may be discarded. However, the device could be relabeled and sold as a different product. For example, if a 3D stacked device has three chips, but has a sub-sliver with two nonfunctional blocks but every sub-sliver has at least one functional block, it may be possible (depending on where the nonfunctional blocks are disposed in the sub-sliver) to form one functional chip from the blocks. Thus, the 3D stacked device could be sold as a 3D stacked device with the logical equivalent of one fully functional chip. In another example, a four-layer 3D stacked device may have two defective blocks in the same sub-sliver. In this scenario, the four-layer device could be sold as a two logical layered device or a one logical layered device (depending on which of the blocks in the sub-slivers are defective). That is, the inactive or unused blocks in neighboring sub-slivers may permit the four layered device to have two logical layers, but in other examples, there may not enough connections to different layers (e.g., the TSVs between the layers) to permit the four layer device to be configured as a two logical layered device. In this example, the four layer device can be sold as a one logical layered device.

However, if none of the sub-slivers contain two or more nonfunctional blocks, the method 500 proceeds to action 514 where the inter-block bridges are configured to avoid the nonfunctional and deactivated blocks. For example, the functional blocks in the sub-slivers can be interconnected by the inter-block bridges within their respective slivers as shown in FIG. 3B to form the logical chips shown in FIG. 3C.

It should be noted that, although the method in FIG. 5 describes testing non-functional blocks in sub-slivers and configuring inter-block bridges, a similar method may be applied to testing and evaluating portions of a 3D stacked device in each sliver and configuring inter-chip bridges to avoid non-functional portions in the 3D stacked device.

Figure 6:
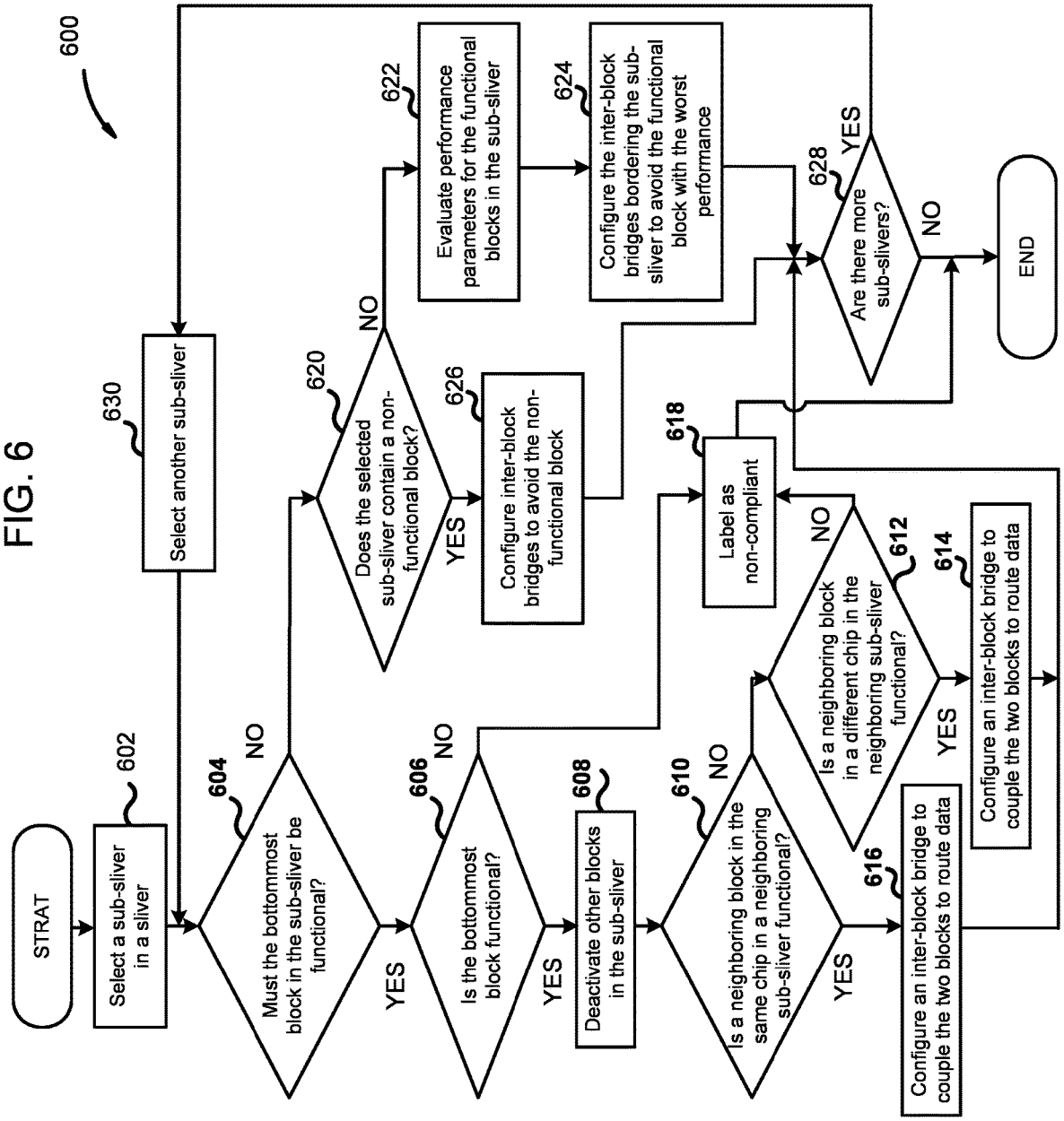
FIG. 6 is a flowchart for configuring the inter-block bridges in the chips of a 3D stacked device, according to an example.

FIG. 6 is a flowchart of a method 600 for configuring the inter-block bridges in the chips of a 3D stacked device, according to an example. In one embodiment, the method 600 begins after action 510 in FIG. 5 where the chips in a 3D stacked device have been tested and none of the sub-slivers has more than one nonfunctional block. In this example, because some blocks must be functional on the bottommost chip, the method 600 can be used to select which of the blocks in the sub-sliver to activate and deactivate to provide a communication path among these blocks.

In action 602, a sub-sliver of a sliver in the 3D stack of chips is selected. In one embodiment, the method 600 forms a loop for evaluating each of the sub-slivers of a sliver in a 3D stacked device to determine which blocks in the selected sub-sliver to activate and deactivate.

In action 604, the method 600 determines whether the bottommost block in the selected sub-sliver must be functional in the bottommost chip. If the bottommost block in the sub-sliver must be functional, the method 600 proceeds to action 606 where the method 600 determines whether the bottommost block is actually functional. If the bottommost block is not functional, the method 600 proceeds to action 618 to mark the device as non-compliant. Otherwise, the method proceeds to action 608 to deactivate the other blocks in the sub-sliver. Then, in action 610, the method 600 determines whether a neighboring block in the same chip but in a neighboring sub-sliver to the bottommost block is functional. If yes, the method 600 proceeds to action 616 to configure an inter-block bridge to couple the two blocks (i.e., the bottommost block and the neighboring block in the same chip) to route data. Otherwise, the method 600 proceeds to action 612 to determine whether a neighboring block in a different chip and in the neighboring sub-sliver to the bottommost block is functional. If yes, the method 600 proceeds to action 614 to configure an inter-block bridge to couple the two blocks (i.e., the bottommost block and the neighboring block in the different chip) to route data. Otherwise, the method 600 proceeds to action 618 to label the device as non-compliant.

Referring back to action 604, if the bottommost block in the sub-sliver is not a block that must be functional, the method 600 proceeds to action 620 where the method 600 determines whether the selected sub-sliver contains a non-functional block. If the selected sub-sliver does not contain a non-functional block, the method 600 proceeds to action 626 to configure inter-block bridges to avoid the non-functional block. Otherwise, the method 600 proceeds to action 622 where the method 600 evaluates performance parameters for the functional blocks in the sub-sliver. For example, when testing the chips, the testing program may determine performance parameters for the respective blocks in the chips such as power consumption, data throughput, signal noise, and the like. In action 622, these performance parameters can be evaluated to rank or prioritize the blocks in the sub-sliver. For example, a weighting algorithm can be used to evaluate the various performance parameters for each block and assign a score to the blocks. The blocks in the sub-sliver can be ranked using the scores. However, there are many different ways for evaluating the performance parameters in order to rank the blocks.

In action 624, the inter-block bridges bordering the sub-sliver are configured to avoid the block with the worst performance. That is, based on the evaluating the performance parameters, the worst performing block in the sub-sliver is selected and deactivated. For example, the worst performing block may be the block with the lowest static power. In one embodiment, assuming all the blocks in the sub-sliver are all operational, the method 600 selects the layer set resulting in the minimums static power configuration. The inter-block bridges can then be configured to route data around the deactivated block in the sub-sliver.

The method 600 in action 628 determines whether there are more sub-slivers in the 3D stacked device to evaluate. If yes, the method 600 proceeds to action 630 to select another sub-sliver (which has not previously been evaluated) and returns to action 604. If there are no more sub-slivers in the 3D stacked device to evaluate, the method 600 ends.

It should be noted that, although the method in FIG. 6 describes testing non-functional blocks in sub-slivers and configuring inter-block bridges, a similar method may be applied to testing and evaluating portions of a 3D stacked device in each sliver and configuring inter-chip bridges to avoid non-functional portions in the 3D stacked device.

The flowchart and block diagrams in the Figures illustrate the architecture, functionality, and operation of possible implementations of systems, methods, and computer program products according to various examples of the present invention. In this regard, each block in the flowchart or block diagrams may represent a module, segment, or portion of instructions, which comprises one or more executable instructions for implementing the specified logical function (s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to specific examples, other and further examples may be devised without departing from the basic scope thereof, and the scope thereof is determined by the claims that follow.

What is claimed is:

1. A 3D stacked device, comprising:
   a plurality of semiconductor chips stacked vertically on each other, wherein each of the plurality of semiconductor chips is logically divided into a same of number of portions, wherein respective first portions from the plurality of semiconductor chips in a first column are grouped together to form a first sliver and respective second portions from the plurality of semiconductor chips in a second column are grouped together to form a second sliver,
   wherein the first sliver and the second sliver are coupled together through inter-chip bridges, wherein at least one of the inter-chip bridges provides at least three communication paths to selectively route data to one of: a portion on a same semiconductor chip, a portion on an upper semiconductor chip, and a portion on a lower semiconductor chip,
   wherein each of the respective first portions in the first sliver comprises a first block and a second block coupled to the first block through a respective inter-block bridge, wherein each respective inter-block bridge provides at most two communication paths to selectively route data to one of: a block on a same semiconductor chip and to a block on a different semiconductor chip,
   wherein the respective first blocks from the plurality of semiconductor chips in a first sub-column are grouped together to form a first sub-sliver, wherein the first blocks in the first sub-sliver comprise an active first block, wherein the respective second blocks from the plurality of semiconductor chips in a second sub-column are grouped together to form a second sub-sliver, wherein the second blocks in the second sub-sliver comprise an active second block and a deactivated second block, wherein a communication path of the respective inter-block bridge is configured to route data from the active first block in the first sub-sliver to the active second block in the second sub-sliver, wherein the active first block is in a same semiconductor chip as the deactivated second block but in a different semiconductor chip from the active second block.

2. The 3D stacked device of claim 1, wherein each of the respective first portions in the first sliver further comprises a third block coupled to the respective second block, wherein the respective third blocks from the plurality of semiconductor chips in a third column are grouped together to form a third sub-sliver, wherein the third blocks in the third sub-sliver comprise an active third block on the same semiconductor chip as the active first block, wherein a communication path of another inter-block bridge is configured to route the data from the active second block in the second sub-sliver to the active third block in the third sub-sliver.

3. The 3D stacked device of claim 2, wherein the first sub-sliver comprises at most one active first block, wherein the second sub-sliver comprises at most one deactivated second block, and wherein the third sub-sliver comprises at most one active third block.

4. The 3D stacked device of claim 1, wherein the first blocks in the first sub-sliver comprise identical circuitry, and wherein the second blocks in the second sub-sliver comprise identical circuitry.

5. The 3D stacked device of claim 1, wherein the respective first blocks in the first sub-sliver comprise different circuitry as the second blocks in the second sub-sliver.

6. The 3D stacked device of claim 1, wherein the active first block in the first sub-sliver comprises one or more of input/output (I/O) circuitry, a transceiver circuitry, hardware intellectual property (IP) circuitry, network-on-chip (NOC) circuitry, and a processor circuitry that interface with a substrate on which the 3D stacked device is disposed.

7. The 3D stacked device of claim 1, wherein at least one of the second blocks in the second sub-sliver comprises programmable logic circuitry for transferring data.

8. The 3D stacked device of claim 1, wherein the second block in each of the plurality of semiconductor chips comprises at least one driver for providing outputs external to the 3D stacked device, and wherein an output of the at least one driver from each of the plurality of semiconductor chips is electrically shorted through at least one interposer.

9. The 3D stacked device of claim 1, wherein the active first block is in a bottommost chip of the plurality of semiconductor chips.

10. A 3D stacked device, comprising:
a plurality of at least three semiconductor chips stacked vertically on each other, wherein each of the plurality of semiconductor chips comprises a first block and a second block coupled to the first block through a respective inter-block bridge, wherein each respective inter-block bridge provides at most two communication paths to selectively route data to one of: a block on a same semiconductor chip and to a block on a different semiconductor chip, wherein the respective first blocks from the plurality of semiconductor chips in a first column are grouped together to form a first sub-sliver of a sliver, wherein the first blocks in the first sub-sliver comprise an active first block, wherein the respective second blocks from the plurality of semiconductor chips in a second column are grouped together to form a second sub-sliver of the sliver, wherein the second blocks in the second sub-sliver comprise an active second block and a deactivated second block, wherein a communication path of the respective inter-block bridge is configured to route data from the active first block in the first sub-sliver to the active second block in the second sub-sliver, wherein the active first block is in a same semiconductor chip as the deactivated second block but in a different semiconductor chip from the active second block.

11. The 3D stacked device of claim 10, wherein the second sub-sliver comprises at most one deactivated second block.

12. The 3D stacked device of claim 10, wherein the first blocks in the first sub-sliver comprise identical circuitry, and wherein the second blocks in the second sub-sliver comprise identical circuitry.

13. The 3D stacked device of claim 10, wherein the first block comprises different circuitry from the second block in each of the plurality of semiconductor chips.

14. The 3D stacked device of claim 10, wherein the active first block in the first sub-sliver comprises at least one of input/output (I/O) circuitry, a transceiver circuitry, hardware intellectual property (IP) circuitry, network-on-chip (NOC) circuitry, and a processor circuitry that interface with a substrate on which the 3D stacked device is disposed.

15. The 3D stacked device of claim 10, wherein at least one of the second blocks in the second sub-sliver comprises programmable logic circuitry for transferring data.

16. The 3D stacked device of claim 10, wherein the second block in each of the plurality of semiconductor chips comprises at least one driver for providing outputs external to the 3D stacked device, and wherein an output of the at least one driver from each of the plurality of semiconductor chips is electrically shorted through at least one interposer.

17. The 3D stacked device of claim 10, wherein the active first block is in a bottommost chip of the plurality of semiconductor chips.

18. A method for configuring a 3D stacked device comprising a plurality of at least three semiconductor chips stacked vertically on each other, the method comprising:
testing a plurality of blocks in each of the plurality of semiconductor chips,
wherein the plurality of blocks in each of the plurality of semiconductor chips comprises a first block and a second block coupled to the first block through a respective inter-block bridge, wherein each respective inter-block bridge provides at most two communication paths to selectively route data to one of: a block on a same semiconductor chip and to a block on a different semiconductor chip, wherein the respective first blocks from the plurality of semiconductor chips in a first column are grouped together to form a first sub-sliver of a sliver, wherein the first blocks in the first sub-sliver comprise an active first block, wherein the respective second blocks from the plurality of semiconductor chips in a second column are grouped together to form a second sub-sliver of the sliver, identifying at least one nonfunctional block in the second sub-sliver,
    wherein the second sub-sliver comprises an active second block and the at least one nonfunctional block; and
configuring a communication path of the respective inter-block bridge to route data from the active first block in the first sub-sliver to the active second block in the second sub-sliver,
    wherein the active first block is in a same semiconductor chip as the at least one nonfunctional block but in a different semiconductor chip from the active second block.

19. The method of claim 18, wherein the plurality of blocks in each of the plurality of semiconductor chips each comprises a third block coupled to the respective second block,
    wherein the third blocks from the plurality of semiconductor chips in a third column are grouped together to form a third sub-sliver of the sliver,
    wherein the third blocks in the third sub-sliver comprise an active third block on the same chip as the active first block.

20. The method of claim 19, further comprising:
configuring a communication path of another inter-block bridge to route the data from the active second block in the second sub-sliver to the active third block in the third sub-sliver.

* * * * *